United States Patent
Baiocchi et al.

(10) Patent No.: US 7,972,873 B2
(45) Date of Patent: Jul. 5, 2011

(54) MATERIAL REMOVING PROCESSES IN DEVICE FORMATION AND THE DEVICES FORMED THEREBY

(75) Inventors: Frank A. Baiocchi, Allentown, PA (US); James Thomas Cargo, Bethlehem, PA (US); John Michael DeLucca, Wayne, PA (US)

(73) Assignee: Agere Systems Inc., Allentown, PA (US)

( * ) Notice: Subject to any disclaimer, the term of this patent is extended or adjusted under 35 U.S.C. 154(b) by 241 days.

(21) Appl. No.: 12/290,054

(22) Filed: Oct. 27, 2008

(65) Prior Publication Data
US 2010/0102398 A1 Apr. 29, 2010

(51) Int. Cl.
H01L 21/00 (2006.01)
H01L 21/302 (2006.01)
H01L 31/062 (2006.01)

(52) U.S. Cl. ............ 438/8; 438/708; 438/745; 257/394; 257/E21.249

(58) Field of Classification Search .............. 438/8, 692, 438/708, 745, 746; 257/394, E27.06, E21.249
See application file for complete search history.

(56) References Cited

U.S. PATENT DOCUMENTS

| | | | |
|---|---|---|---|
| 6,251,787 B1 * | 6/2001 | Edelstein et al. | 438/692 |
| 6,511,915 B2 * | 1/2003 | Mlcak | 438/695 |
| 2009/0029490 A1 * | 1/2009 | Baiocchi et al. | 438/14 |

OTHER PUBLICATIONS

U.S. Appl. No. 12/220,169, Baiocchi, Frank A., et.al.
Baiocchi, Frank A. et.al.,"Voiding in Cu Technology Through Photovoltaic . . . " Proc. of 33rd International Symp for Testing and Failure Analysis, San Jose, CA, ASM, (2007).
Chen, H.C. et.al., The Investigation of Galvanic Corrosion . . . Interconnect Technol Conf, 2000, Proc of IEEE Internat'l, 2000, pp. 256-258.
Chiou, W.C. et.al., Electrochemically Induced Defects . . . Interconnect Tech Conf, 2004, Proc of IEEE 2004 Internat'l, pp. 127-129.

* cited by examiner

*Primary Examiner* — Hsien-ming Lee

(57) ABSTRACT

Devices having voids are producible by employing an electrochemical corrosion process. For example, an electrically conductive region is formed to have a surrounding chemically distinct region. Such formation is possible through conventional semiconductor processing techniques such as a copper damascene process. The surrounded conducting material is configured to be in electrical communication with a charge separation structure. The electrically conducting region is contacted with a fluid electrolyte and electromagnetic radiation is made to illuminate the charge separation region to induce separation of electrons and holes. The resulting separated charges are used to drive an electrochemical corrosion process at the conductive material/electrolyte interface resulting in the removal of at least a portion of the electrically conducting material. The induced corrosion leaves a void that is useful, for example, as a highly effective dielectric in integrated circuits, functions to allow component separation such as gear separation in microelectromechanical devices or produces long cavities useful for material separation analogous to the distillation columns used in liquid chromatography.

18 Claims, 3 Drawing Sheets

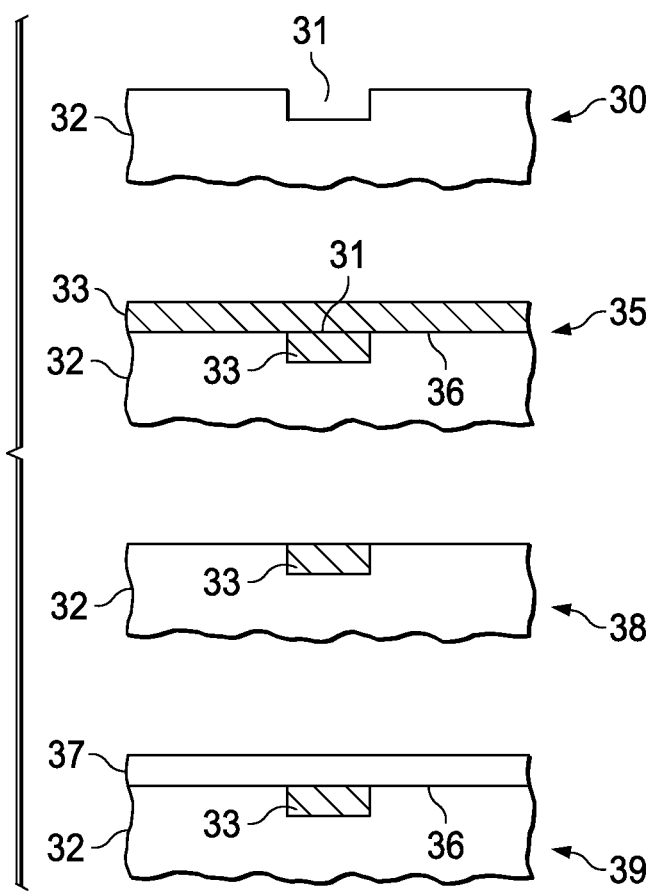
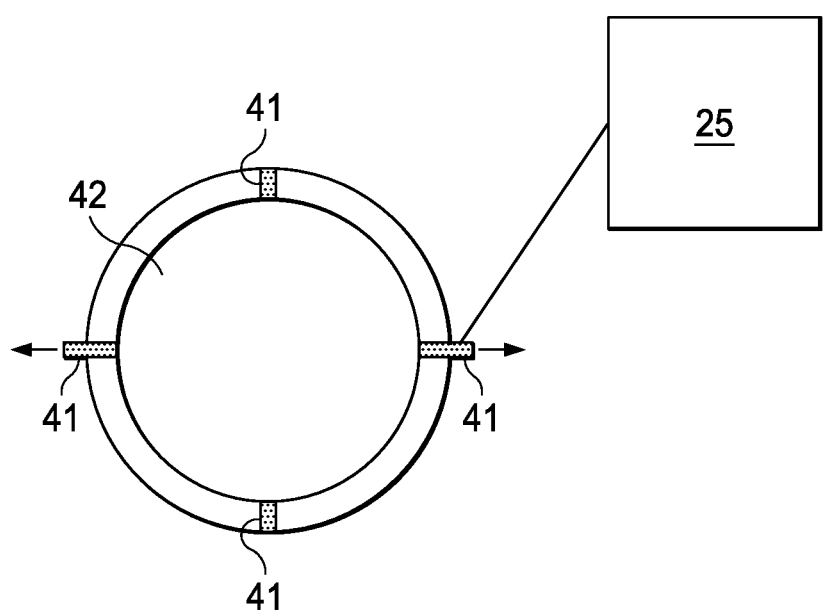
FIG. 3
FIG. 4

MATERIAL REMOVING PROCESSES IN DEVICE FORMATION AND THE DEVICES FORMED THEREBY

CROSS REFERENCE TO RELATED APPLICATION

This application is related to Baiocchi 7-9-4-36, U.S. patent application Ser. No. 12/220,169 filed Jul. 22, 2008 which is hereby incorporated by reference in its entirety.

TECHNICAL FIELD

This invention relates to device processing and in particular device processing involving material removal.

BACKGROUND OF THE INVENTION

A large variety of devices such as microelectro-mechanical systems (MEMS), and integrated circuits are fabricated by procedures that involve the sequential formation of patterned and unpatterned layers upon a substrate. The formation of such layers generally involves steps such as material formation, e.g. deposition or oxidation steps; material removal, e.g. material etching steps; and/or material patterning steps, e.g. steps involving lithographic processes. The number of different procedures available for accomplishing the desired device layer processing is quite extensive. Texts such as S. Sze, VLSI Technology, McGraw-Hill, 1988, describe the panoply of processing steps available in integrated circuit manufacture. Additionally, many of these integrated circuit fabrication procedures have been adapted for other devices such as MEMS devices and further procedures specific to such devices have also been developed. (For example, see F. E. H. Tay, (Ed.), *Materials and Process Integration for MEMS*, Springer, 2002 for a description of fabrication procedures used in MEMS formation.)

Exemplary of fabrication techniques used in current generation integrated circuit formation is the damascene procedure for patterning copper interconnections between device structures such as transistors and capacitors. Thus, as shown in FIG. 1, in one example, transistors, 3, including drains, 8, gates, 7 and sources, 5, are produced on substrate, 6, using conventional techniques. Subsequently in the fabrication sequence, a layer such as an insulating layer, 2, is deposited by techniques such as sputtering or chemical vapor deposition. A pattern of trenches, 15, are formed in the insulating layer using conventional photolithographic and dry etching e.g. reactive ion etching, procedures. In one approach, a thin barrier layer such as a tantalum or tantalum nitride layer is deposited in the trench with subsequent formation of a copper seed layer, in turn, on the tantalum or tantalum nitride region. (The seed layer promotes subsequent electrochemical deposition.) Bulk copper is then electrochemically deposited into the trench, 15, and onto the surface of insulating layer, 2. The copper portion lying above trench 15 and on the surface of insulator 2 is removed by chemical-mechanical polishing (CMP) leaving trench 15 filled with copper. Thus the copper interconnects 16 are formed in the pattern of the trenches. Subsequent processing includes for example deposition of layer 17 with patterning and damascene processing of via 12 followed by deposition of an overlying cap layer 14 such as a silicon dioxide, silicon carbide, or silicon nitride layer.

The manufacture in this manner of devices by sequential layer formation leads, in integrated circuits, to a monolithic structure such as shown in FIG. 1. In contrast, MEMS devices are not necessarily monolithic but often include voids or other open areas. For example, MEMS devices designed for chromatographic analysis of very small samples include elongated, straw-like channels that act as chromatography columns. (See for example, D. Banks, *Microengineering MEMS and Interfacing: A Practical Guide*, CRC Press, 2006 for a description of one such device.) Alternatively, many MEMS structures designed to operate as miniature mechanical machines often require, during formation, the freeing of structures such as gears from the substrate in which such gears are formed. Again, to free the mechanical structure void formation is required. Such result has required techniques not standard to integrated circuit processing. For example, the channels of a microminiature chromatographic column are formed by crystallographically selective etching—a not particularly economic procedure to integrate with standard integrated circuit processing.

It is generally preferable in device formation to use conventional integrated circuit processing techniques. The development of new techniques is frequently a costly task. Additionally, often the use of such techniques requires modification of the processing sequence conventionally used and such techniques possibly are not compatible with the device structures and materials. Thus both this development and the resulting required modifications lead to undesirable cost consequences. Indeed, it is the goal in device processing to eliminate rather than add processing steps while producing economic, conventional or newly emerging devices.

SUMMARY OF THE INVENTION

Inventive devices having voids are producible with conventional processing techniques. Further, the patterning of such voids is accomplished without the necessity of additional lithographic steps from those already needed to produce metal regions of the device. In particular, during the formation of the device it is possible not only to form a desired metal pattern but also to form even concurrently a patterned void structure. For example, the trenches made during a damascene process are formed to have a pattern that includes both the ultimate metal regions desired for the device operation and also regions corresponding to voids to be concomitantly used in such device. To exemplify, in the cross-sectional view of FIG. 2, regions denominated 22 are to be subsequently filled with metal while regions 23 are ultimately to be voids i.e. regions filled with a fluid such as air. The trench patterns including both regions 22 and 23 are filled with a conductive material such as copper by for example, deposition followed by CMP. The trenches 23 corresponding to the ultimate void structures are configured to extend to a charge separation structure 25, e.g. p-n junction. Thus, when these structures are filled with a conductive material, there is an electrically continuous path to a charge separation structure. (A charge separation structure in the context of this disclosure includes any structure such as 1) an interface between a p-type semiconductor and a n-type semiconductor and/or 2) a Schottky barrier and/or 3) a p-i-n (p-type semiconductor-insulating material—n-type semiconductor), that produces a separation of charges, i.e. separation of holes from electrons as evidenced by development of a current or voltage, when illuminated with electromagnetic radiation.) This charge separation structure is formed either in the device itself or in regions of the substrate such as channel regions between dies in integrated circuit manufacture that will not be part of the final device.

After formation of the conducting regions in both trenches 22 and 23 device fabrication is continued leading to overlying the conducting material typically with an insulating material, 24. Electromagnetic radiation is made incident on the charge separation structure to which the conductive material occupying trenches 23 are connected. This illumination of the charge separation structure is done in the presence of a fluid electrolyte that contacts at least some portion of the conductive material occupying trenches 23. The illumination of the charge separation structure introduces a separation of electrons and holes. Thus the conductive material in trenches 23 are charged and undergo an electrochemical corrosion induced by such charge at the interface with the electrolyte. Through the continued electrochemical corrosion of the conductive material occupying trenches 23, voids are formed and the gaseous ambient such as air infuses into these voids typically during the drying process.

Accordingly, since the conductive material in trenches 23 is removed by a electrochemical wet process costs associated with new techniques are avoidable. Additionally, it is possible to pattern the trenches 23 leading to such voids by standard damascene procedures and require no additional lithographic processing steps. As a result, void structures are formed without necessitating additional processing steps or modification of device processing sequences. This result presents the ability to fabricate novel integrated circuits with voids and a more cost effective approach for structures such as microminiature chromatographic channels and separated mechanical entities, e.g. gears, in other devices, e.g. MEMS devices. Integrated circuits with voids are particularly attractive because the low dielectric constant of, for example, air is employable to improve the high frequency characteristics of the circuit design.

BRIEF DESCRIPTION OF THE DRAWINGS

FIGS. 1 through 4 are illustrative of concepts involving the invention.

DETAILED DESCRIPTION

As discussed, the invention involves forming a device or structure with voids and the ability to accomplish this goal without the necessity of employing unconventional semiconductor processing techniques. The basis of the inventive technique includes 1) forming a conductive region surrounded, at least in part, by a solid material distinct from such conductor; 2) electrically connecting this electrically conducting region to one side of a charge separation structure; 3) allowing electromagnetic radiation to be incident on this charge separation structure to produce separation of electrons and holes; and 4) allowing a fluid electrolyte to contact the conducting region so that at least a portion of the conducting region connected to the separation structure is removed to produce a void. (Void in the context of this invention is a region having a volume of at least 1000 $nm^3$ that is occupied by a fluid, e.g. air.)

Figure 1:
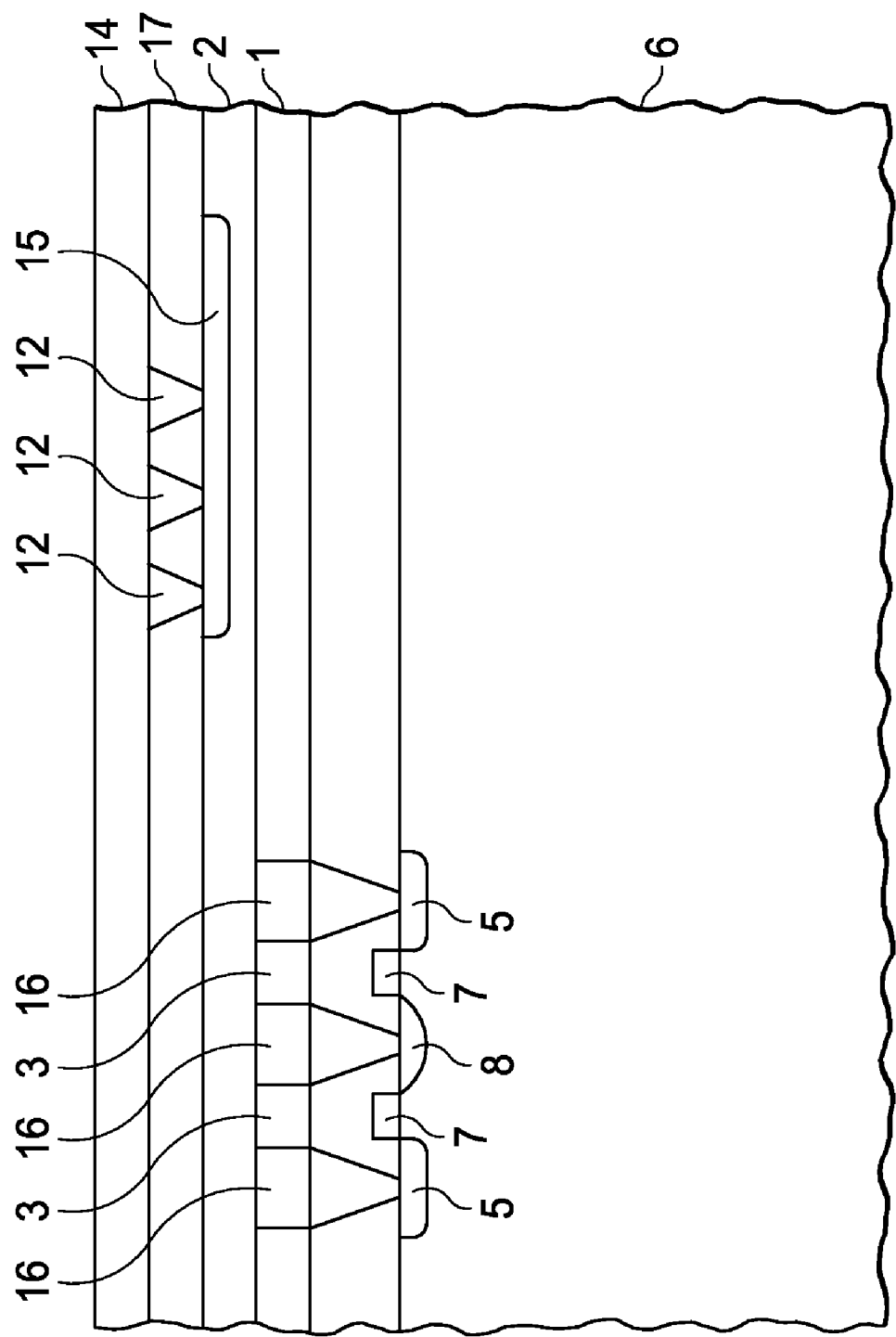
Figure 2:
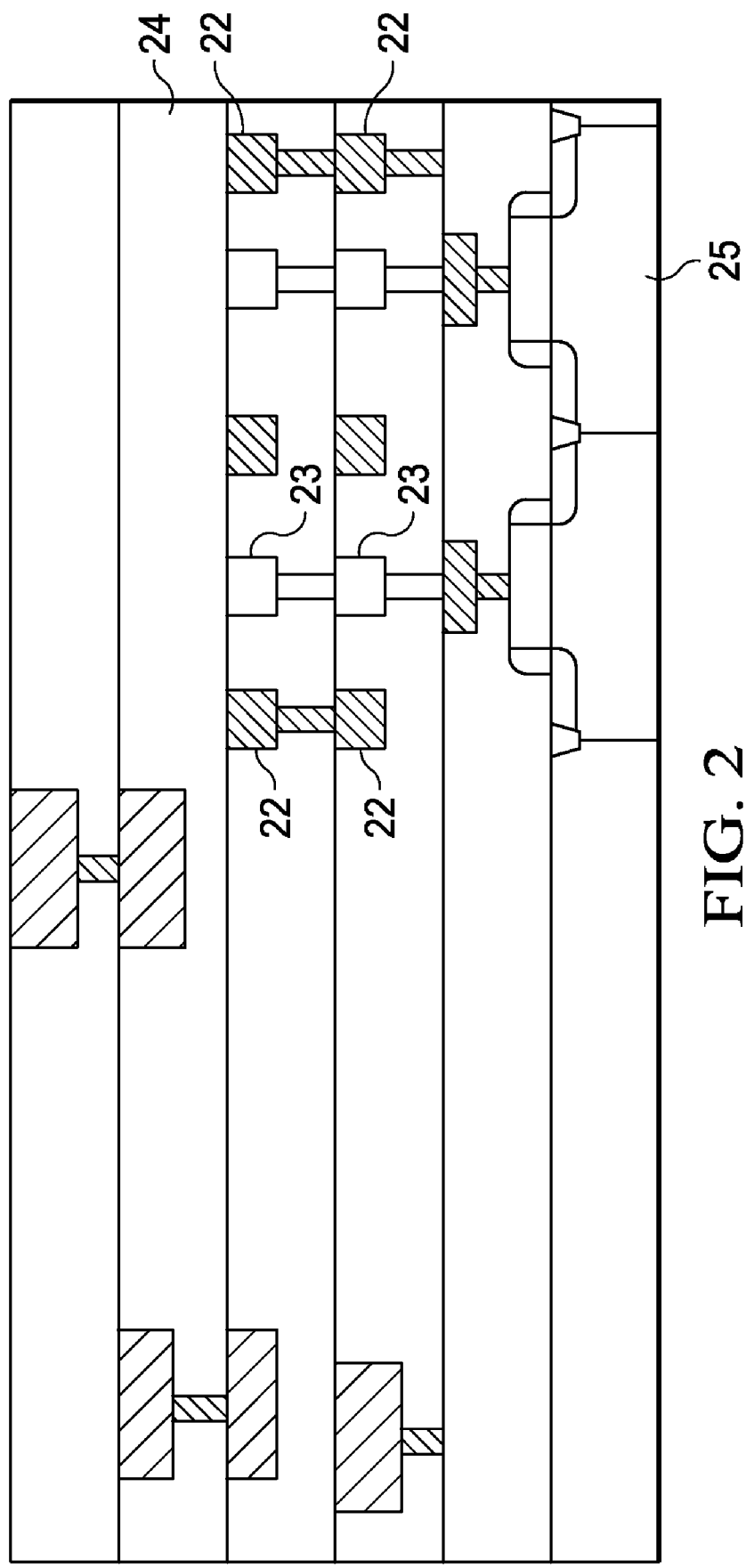

A variety of techniques are available for producing a conductive region, (e.g. a metal region) that is surrounded, at least in part, by a chemically distinct solid material. For example, it is possible to use either the single or dual damascene technique to accomplish this result. (Both the dual and single damascene techniques are fully described in Handbook of Semiconductor Manufacturing Technology, 2.sup.nd ed., R. Doering and Y. Nishi (Eds.) CRC Press, 2007.) Briefly, in one such technique in a first step, 30, a trench, 31, is formed in a substrate, 32 such as a semiconductor material substrate e.g. a silicon substrate. The substrate typically is a device being processed such as an integrated circuit or a MEMS device. For an integrated circuit this trench is advantageously formed in the multilayer metallization region that electrically interconnects circuit elements such as transistors, as seen in FIG. 2, while for MEMS devices, such a trench is advantageously formed for purposes of material transport, structure release, or providing a solid to fluid interface. In a second step, 35, the trench, 31, is filled with a conducting material indicated by cross-hatched region, 33. The portion of region 33 disposed on surface 36 of substrate 32 is removed by techniques such as CMP to leave the structure as shown at 38. In a step shown at 39, a solid material, 37, that is chemically disparate from conducting material, 33 is formed on surface 36 to surround at least a portion of material 33 that has assumed the configuration of trench 31.

It is possible to form a patterned trench configuration by a variety of techniques such as reactive ion etching in combination with, for example, photolithographic techniques. The deposition of conductive materials such as metals is accomplished in one embodiment by techniques such as sputtering or chemical vapor deposition. (Such photolithographic, deposition, and etching techniques are fully described in texts such as Doering and Nishi supra.) In a second approach for producing a suitable metal region, a blanket layer of a conducting material is formed on a substrate. Patterned resist material is used to remove portions of the blanket region leaving metal in a desired pattern. A solid material chemically disparate from the conducting material is then deposited over the pattern conducting region leaving this conducting region surrounded by another material. Although two procedures for metal region formation have been described, the inventive approach subsumes as a step the formation of a surrounded electrically conductive region irrespective of the specific techniques employed.

The cross-sectional dimensions of the surrounded conducting material depend on the particular ultimate application for the device being fabricated. For example, in the application related to micro-chromatography typical cross sections having dimensions in the range 0.001 to 10,000 $\mu m^2$ are useful. Similarly, voids used to produce a dielectric region advantageously have dimensions generally in the range 0.001 to 1000 $\mu m^2$. The larger the dimensions, the slower the ultimate etching process to remove the conducting region. Typically dimensions greater than 10 $\mu m$ lead to inconvenient processing times but are not precluded. Dimensions smaller than 0.01 $\mu m$, although not precluded, are generally undesirable because they tend not to provide sufficient mechanical separation in MEMS devices or effective voids in microelectronic devices such as IC's. The use of a metal such as copper is convenient since conventional damascene processes employ such material. However, other conducting materials such as aluminum, iron, and nickel are also useful. The form of the conducting material is not critical and compositions such as alloys, and/or doped metals are employable provided the electrochemical potential for corrosion in the chosen electrolyte drives formation of aqueous ionic species from the solid material. (A conducting material for purposes of this disclosure is one having resistivity in the range 1 µOhm-cm to 1 mOhm-cm, preferably in the range 1 to 20 µOhm-cm. Materials with lower conductivity generally lead to unacceptably slow etching.)

A variety of materials are available to surround the patterned conducting region. Exemplary of such materials are insulators such as a silicon oxides, (e.g. silicon dioxide, silicon monoxide), silicon nitride, silicon carbide and polymers such as polymethyl-methacrylate, polyimides, or low K polymers. (See Doering and Nishi supra for a description of formation of regions composed of such materials. Suitable techniques for such formation include chemical vapor deposition, plasma assisted deposition, formation of native oxides, electron beam evaporation and rf sputtering.) The surrounding region is considered chemically disparate from the conducting region if its composition and/or chemical bonding is different. For example, the composition and covalent bonding of an oxide dielectric is different than the metallic bonding of a metal such as copper where the difference is observable by a measurement of the resistivity of the materials. Thus besides insulators other surrounding materials such as metals e.g. tantalum (which has metallic bonding but is compositionally different from, for example, copper) are also useful as a surrounding material since the difference in electrochemical potential allows selective removal of the copper. Generally, to avoid erosion of the surrounding material during electrochemical etching, it should have a resistivity greater than approximately 1000 Ohm-cm or should be chemically resistant to such electrochemical corrosion process. For example, as discussed, a more noble metal or a metal that exhibits passive characteristics in the employed electrolyte is useful as a surrounding material. Typically, such chemical resistance is characterized by a removal rate at least ten times slower than that of the conducting region in the device configuration and under the processing conditions employed.

The electrochemical corrosion process is induced by allowing electromagnetic radiation to be incident on a charge separation structure. Suitable charge separation structures include interfaces between p and n semiconductor materials, Schottky barriers and p-i-n structures. To produce nominal electrochemical corrosion rates, it is desirable to employ light intensities in combination with charge separation configurations that result in charge separation capable of creating a current of at least 1 picoAmp. For example, a p-n junction formed in silicon with majority carrier concentrations in the range $1\times10^{15}$ to $1\times10^{20} cm^{-3}$ yield such charge separations for light of intensity 100 Lux or greater (advantageously 10,000 Lux or greater) having a wavelength shorter than about 1127 nm but longer than about 200 nm. Typically the electromagnetic radiation should have an energy greater than the bandgap of the substrate semiconducting material. Nevertheless, configurations that allow tunneling using less energetic electromagnetic radiation is not precluded.

There are a variety of possibilities for locating the charge separation structure on the device substrate during processing. For example, such charge separation structure is advantageously a junction-type capacitor or a capacitor array employed in the device. Alternatively, the charge separation structure is configured to remain in the device after processing but is not involved in the circuitry that ultimately functions to produce the desired application for the device. In another embodiment, the charge separation structure is located in a region that is ultimately not part of the finished device. Thus, in integrated circuit manufacture a multitude of devices are typically produced on a single wafer. These devices are separated by regions of the wafer that are ultimately discarded when the devices are freed from such wafer. It is possible to use these ultimately discarded regions for forming the rectifying junction. Accordingly when the devices are separated, the rectifying regions so formed are removed and discarded.

The conductive region should be in electrical communication with the charge separation structure. Whether this region contains excess electrons or excess holes depends on the particular electrochemical corrosion process chosen. For example, in the electrochemical removal of copper and most metals using water as an electrolyte, the copper or other metal is formed to be in electrical communication with a region containing excess holes. (Electrical communications in this context means that there is a resistance of less than 10,000 Ohms between the conductive region that is ultimately removed and the rectifying interface.)

The electrolyte chosen depends on the particular corrosion reaction that is to be induced. Generally an aqueous electrolyte has a resistivity of 18.5 MOhm-cm or less. For many applications, such as the removal of copper, an electrolyte such as distilled water, an acidic solution, or a chelating solution is useful. The particular technique employed for forming the contact between the electrolyte and the region to be removed is not critical. In one embodiment, vias to the metal region are etched in the surrounding material by conventional techniques and the device being processed is immersed in the electrolyte. (It is possible to use one or more of such vias.) In such configuration, the electrolyte is chosen so that it does not unduly attenuate the electromagnetic energy allowed to be incident on the rectifying region. The conductive entity in the electrolyte is generally not critical but should be chosen so that it does not unacceptably limit the electrochemical corrosion reaction.

The inventive process is employable for forming a variety of useful entities. In one embodiment, integrated circuits having voids are producible. Voids filled with a fluid such as air, act as an excellent dielectric material. The use of the inventive procedure as described supra is employable to form such voids. For example, the voids are formed in regions of relative small metallization spacing e.g. less than 5 μm in an integrated circuit employed for applications such as rf signal processing. Such voids to produce suitable dielectric properties should have dimensions in the range 10 nm to 100 μm and generally occupy a volume in the range 1000 $nm^3$ to 10,000 $\mu m^3$. The fluid is introduced into such void simply, for example, by immersing the device in the fluid such as air and allowing diffusion or capillary forces to act. Such immersion is advantageously accomplished before the packaging of the device in relatively impermeable material.

In another embodiment, the inventive procedure is employed to separate mechanical structures from the substrate in MEMS devices. Such separation is accomplished as illustrated in FIG. 4. In this figure, metal regions 41 are removed by electrochemical corrosion as previously described to release structure 42 that is, for example, a mirror or a gear. This removal is accomplished by electrically connecting regions 41, to a suitable charge separation structure, such as the separation structure 25 shown in FIG. 2 and inducing corrosion through the presence of light and an electrolyte. Additionally, as previously discussed, void structures are employable as a chromatographic device. In one approach, if the charge separation structure is illuminated during material processing the separated charge promotes electrophoretic separation of the material being subjected to chromatography. It is also possible that the charge for such electrophoresis is provided from a power source external to the MEMS device through an external input. In this vein for MEMS devices/structures it is possible to use an external power source to drive the electrochemical corrosion either as the sole charge source or together with a charge separation structure. For MEMS devices the external power source is electrically connectable to the metal region to be electrochemically removed by, for example, an external input.

The invention claimed is:

1. A process for fabricating a device comprising:
    forming conductive regions on a semiconductor substrate, said conductive regions being located within or surrounded by a dielectric material; electrically connecting at least a portion of said conductive regions to a charge separation structure;

allowing electromagnetic radiation to be incident on said charge separation structure to produce an electrical current between said conductive regions and said charge separation structure; and allowing a fluid electrolyte to contact said conductive regions such that a portion of said at least portion of said conductive regions electrically connected to said charge separation structure is removed to produce a void of having a volume of at least 1000 nm$^3$, whereby said void functions as an operative structure of said device.

2. The process of claim 1 wherein said operative function comprises a dielectric region that attenuates high frequency rf interactions.

3. The process of claim 2 wherein said void is positioned between two of said conductive regions.

4. The process of claim 1 wherein said operative function comprises a chromatographic column.

5. The process of claim 1 wherein said device comprises an integrated circuit.

6. The process of claim 1 wherein said device comprises a MEMS device.

7. The process of claim 1 wherein said conductive regions comprise copper.

8. The process of claim 1 wherein said conductive regions comprise aluminum.

9. The process of claim 1 wherein said dielectric material comprises silicon oxide.

10. The process of claim 1 wherein said semiconductor substrate comprises silicon.

11. A process of forming a MEMS device on a substrate comprising:

forming conductive regions within a dielectric material about a MEMS component connecting said conductive regions to a charge separation structure;

contacting said conductive regions with an electrolyte, and allowing light to be incident on said charge separation structure whereby said conductive regions are removed by electrochemical corrosion thereby releasing said MEMS component.

12. The process of claim 11 wherein a void suitable for chromatographic procedures is formed between two of said conducting regions.

13. The process of claim 12 wherein the charge separation structure remains in said MEMS device as a source of charge for electrophoretic procedures.

14. The process of claim 11 wherein an external power supply rather than said charge separation structure is electrically connected with said conductive regions and drives said electrochemical corrosion.

15. The process of claim 11 wherein said MEMS component is a gear or mirror.

16. The process of claim 11 wherein said substrate comprises silicon.

17. A silicon integrated circuit comprising a substrate comprising silicon, a plurality of transistors, a plurality of conducting regions electrically connecting said transistors and a void positioned between two of said conducting regions whereby high frequency interaction between signals in said two of said conducting regions is attenuated.

18. The integrated circuit of claim 17 wherein said conducting region comprises copper.

* * * * *